(12) United States Patent
Van Helvoort et al.

(10) Patent No.: US 7,307,422 B2
(45) Date of Patent: Dec. 11, 2007

(54) MRI SYSTEM WITH RF RECEIVER COILS FIXED TO THE HOUSING

(75) Inventors: Marinus J. A. M. Van Helvoort, Eindhoven (NL); Robert P. Kleihorst, Eindhoven (NL); Diana M. F. Geraats, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/595,739

(22) PCT Filed: Nov. 4, 2004

(86) PCT No.: PCT/IB2004/052297

§ 371 (c)(1),
(2), (4) Date: May 8, 2006

(87) PCT Pub. No.: WO2005/047915

PCT Pub. Date: May 26, 2005

(65) Prior Publication Data
US 2007/0069728 A1    Mar. 29, 2007

(30) Foreign Application Priority Data
Nov. 12, 2003  (EP) .................................. 03104163

(51) Int. Cl.
*G01V 3/00* (2006.01)
(52) U.S. Cl. ..................................................... 324/318
(58) Field of Classification Search ......... 324/300–322
See application file for complete search history.

(56) References Cited

U.S. PATENT DOCUMENTS

| | | | |
|---|---|---|---|
| 4,682,112 A | 7/1987 | Beer | |
| 5,457,387 A * | 10/1995 | Patrick et al. | 324/318 |
| 5,551,430 A * | 9/1996 | Blakeley et al. | 600/410 |
| 5,600,244 A | 2/1997 | Jensen et al. | |
| 5,664,568 A * | 9/1997 | Srinivasan et al. | 600/422 |
| 5,945,826 A | 8/1999 | Leussler | |
| 5,952,830 A * | 9/1999 | Petropoulos et al. | 324/318 |
| 5,969,525 A | 10/1999 | Van Driel et al. | |
| 5,986,531 A * | 11/1999 | Carrozzi | 335/301 |
| 6,198,284 B1 * | 3/2001 | Doty | 324/318 |
| 6,223,065 B1 | 4/2001 | Misic et al. | |

(Continued)

FOREIGN PATENT DOCUMENTS

JP    6181907 A    7/1994

(Continued)

OTHER PUBLICATIONS

Pruessmann, K.P., et al.; SENSE:Sensitivity Encoding for Fast MRI; 1999, MRM; 42:952-962.

*Primary Examiner*—Brij Shrivastav
*Assistant Examiner*—Dixomara Vargas

(57) ABSTRACT

An MRI system (1) comprises a housing (10) defining an examination space (2) for receiving a body for examination, a patient table (3) being displaceable into and out of the examination space (2), a magnetic field generating system (4) for generating a magnetic field in the examination space (2), and an electromagnetic resonance receive system (5) which comprises a set of dedicated receive coils (20). According to the invention at least one dedicated receive coil (20) is fixedly attached to the housing (10).

17 Claims, 3 Drawing Sheets

U.S. PATENT DOCUMENTS 6,348,794 B1 *  2/2002  Nabetani et al. ............ 324/318
6,441,615 B1    8/2002  Fujita et al.
6,591,128 B1 *  7/2003  Wu et al. .................. 600/422
6,717,406 B2 *  4/2004  Sodickson ................. 324/307
6,768,303 B1 *  7/2004  Su et al. .................... 324/309

FOREIGN PATENT DOCUMENTS

WO    WO 0127647 A1    4/2001

* cited by examiner

MRI SYSTEM WITH RF RECEIVER COILS FIXED TO THE HOUSING

BACKGROUND

The present invention relates to a magnetic resonance imaging (MI) system comprising a housing defining an examination space for receiving a body for examination, a magnetic field generating system for generating a magnetic field in the examination space, and an electromagnetic resonance receive system which comprises at least one dedicated receive coil.

MRI technology is generally known, and does not need to be explained in great detail here. Suffice it to say that this technique involves applying an electromagnetic field to a body under examination such that the magnetization vector in the imaging volume is rotated. After the RF excitation has been removed, the magnetization vector is precessing about the B0 field lines at the Larmor frequency, thus causing RF magnetic resonance signals that can be received by RF receiving coils.

MRI systems generally comprise an examination space for receiving a body for examination, such as a patient, and a magnetic field generating system for applying the required magnetic field to the examination space. Such magnetic field generating system typically comprises a static magnetic field coil for generating a static field or B0 field, one or more gradient coils for generating a gradient field, and one or more excitation coils for generating an RF magnetic field or B1 field. This magnetic field generating system is arranged in a housing, arranged close to the examination space. In a typical example, the B0 field has a direction parallel to the longitudinal axis of a body to be examined, and the housing of the magnetic field generating system has a substantially annular shape extending around the examination space. In such case, the examination space is also indicated as "bore". In another typical example, the B0 field has a direction perpendicular to the longitudinal axis of a body to be examined, and the housing of the magnetic field generating system comprises an upper housing and a lower housing each having a substantially disc-shaped contour, arranged above and below the examination space, respectively. In such case, the system is also indicated as "open system".

MRI systems further comprise receive antennas for receiving the electromagnetic radiation transmitted by the relaxing particles. One or more of the transmit coils of the magnetic field generating system may be used as a receive antenna. A typical example is a quadrature whole-body transmit-receive coil, also indicated as QBC.

For improved imaging performance, special antenna elements have been developed, which are intended to be placed close to the body under examination. Which antenna element to be used depends on the body part to be examined. These special antenna elements are also indicated as local coil or dedicated receive coil DRC. It is noted that in some systems only local coils are used as receive antenna, i.e. the receive system does not comprise any of the transmit coils of the magnetic field generating system.

In the state of the art, these dedicated receive coils are separate elements, which are placed on the body by medical personnel. As such, the use of such dedicated receive coils is associated with some problems. A first problem relates to the imaging process. Imaging involves processing the signals picked up by the antenna elements and generating images which can be suitably viewed by people, especially medical staff. Positioning of the antenna elements by hand may be a source of errors in that the actual position of an antenna element does not correspond sufficiently with the expected position, because the antennas are placed on the outside of the patient and the object to be imaged is on the inside.

Said signal processing is performed by a specialized computer. Some of the image reconstruction methods in the software in this computer have been developed under the assumption that the antenna elements have a defined position.

This problem is especially important in case it is intended to perform imaging according to the SENSE method. This method is known per se to persons skilled in the art. By way of example, reference is made to a descriptive article "SENSE: Sensitivity Encoding for Fast MRI" by Klaas P. Pruessmann in Magnetic Resonance in Medicine, 42, 1999, p. 952-962. The sense method requires that the position of the antenna elements be accurately known. To this end, the state of the art requires that, before the actual examination, a reference scan be made, producing information on the actual position of the antenna elements. A complicating factor is that, in order for this information to be valid in the actual patient examination, the patient is not allowed to move (in an undefined manner) between the reference scan and the examination scan.

A further problem relates to the mere fact that arranging dedicated receive coils requires the presence and time of trained medical personnel. Also, arranging the dedicated receive coils must be done at the MRI system, i.e. this procedure occupies the system which at the time is idle, so that the system cannot be used in a cost-efficient way.

A further problem relates to the fact that the process of arranging dedicated receive coils, and removing them later, involves handling which may cause damage to the coils, resulting in a possible need for repair (costs) and the risk of being out-of-service for some time.

A further problem relates to the fact that the antenna elements may be a hindrance when it is desired to arrange other sensors on the patient's body, for instance for generating ECG signals.

A further problem relates to patient-friendliness. The requirement of lying motionless between two scans has already been mentioned. Also, during a scan, a patient should not move since this might shift the dedicated receive coils. Apart from that, the fact that a number of antenna elements is arranged on the patient's body in uncomfortable for the patient, and the patient may even feel confined.

Nowadays, there is an increasing demand for whole-body scans, i.e. imaging of the whole body of the patient. In the state of the art, whole-body imaging with dedicated receive coils requires that the whole body of the patient be covered with a large number of coils. Not only is this very uncomfortable to the patient, but it is also labour-intensive for the personnel who must place and remove the coils in respect of each patient or scan. Further, it involves handling many thick cables and many connectors. With a view to safety, it is desirable to reduce the number of cables close to the patient.

U.S. Patent application 2002/0138001 A1 discloses an MRI system having at least one local coil secured to a movable carrier, which carrier is connected to a carrier mount which is arranged stationary in the examination space. In use, the patient is positioned in the examination space, and then the carrier is moved, controlled from a remote position, to push the local coil against the patient's body. Although such systems will reduce some of the problems mentioned above, it still leaves some problems or even introduces others.

For instance, the need for a movable carrier increases the complexity and costs of the system.

Further, the fact of feeling an item being pressed against his body may be uncomfortable to the patient.

Further, and very importantly, the size of the examination space is already very small, providing just enough room for receiving a patient, and this in itself may already pose problems in the case of obese patients. A movable carrier plus carrier mount, arranged in the examination space, further reduces the "free" room in the examination space.

Further, since the local coil in this system is positioned by pushing it against the patient's body, the actual position of the local coil is not defined in advance since it is determined by the size of the patient.

Further, especially in the case of whole-body imaging, it is generally desirable to have receive coils positioned at the side of the patient. In the embodiment shown in said publication, only one movable carrier is located in the upper area of the bore.

SUMMARY

A general objective of the present invention is to eliminate or at least reduce at least one and preferably all of the above-mentioned problems.

In order to achieve said objective, an MRI system according to the present invention is characterized in that at least one dedicated receive coil is fixedly attached with respect to the housing or with respect to at least one transmit coil of the magnetic field generating system. Thus, the process of handling the receive coils can be omitted, and the position of this coil is always known very accurately.

In a preferred embodiment, the MRI system comprises multiple fixed dedicated receive coils located at different positions. Thus, it is possible to obtain images from multiple body parts simultaneously. Also, it is possible to select a suitable one of said multiple fixed dedicated receive coils for obtaining an image of a specific body part.

In an advantageously simple embodiment, which is easy to implement, the fixed dedicated receive coil comprises a loop of conductive material, arranged on an insulating substrate. In view of the excellent mechanical and insulating properties, the insulating substrate is preferably implemented as a thin sheet of polycarbonate or the like.

For further insulation, an insulating layer may be arranged on the substrate, extending over the loop. The embodiment thus achievable can be very thin, so that it can be incorporated in the interior of the system housing; alternatively, this thin embodiment of this dedicated receive coil can be fixed in the examination space without substantially reducing the size of the examination space.

For allowing the dedicated receive coil to be easily arranged on a cover plate of the examination space, the thickness of the fixed dedicated receive coil is preferably so small that the receive coil is flexible so that it can be bent. Alternatively, the dedicated receive coil may have a stiff substrate having a substantially constant shape, in which case it is advantageous if the dedicated receive coil has a substantially constant shape, this shape being curved in accordance with the curved shape of a part of the cover of the examination space.

In a preferred embodiment, the system comprises a housing which comprises at least one cover plate adjacent the examination space, wherein the dedicated receive coil is fixed to the cover plate. Thus, the distance between the coil and the patient under examination is always smallest possible.

In a preferred embodiment, the dedicated receive coil is fixed to the interior of the cover plate, so that the cover plate itself can act as insulator.

In an alternative preferred embodiment, which is particularly useful in cases where the interior of the housing does not have sufficient room for placing the coil, or where it is desired for the dedicated receive coil to be located closest possible to a body to be examined, the dedicated receive coil is fixed to the exterior of the cover plate. The design of the fixed dedicated pickup coil can be very thin, in the order of less than one millimeter, so that the valuable room in the examination space can be preserved to a very large extent.

In a specially preferred embodiment, the fixed dedicated receive coil is integrated in a cover plate. Then, the coil is completely insulated and protected by the cover plate material.

In all cases where the fixed dedicated receive coil is integrated in or fixed to a cover plate of the housing, the cover plate is preferably used as a detachable part of the housing. This facilitates handling, mounting, replacing etc. the coil. Mounting of such cover plate is further facilitated if the cover plate comprises two or more plate segments, coupled to each other by hinges.

BRIEF DESCRIPTION OF THE DRAWINGS

These and other aspects, features and advantages of the present invention will be further explained by the following description with reference to the drawings, in which the same reference numerals indicate the same or similar parts, and in which.

DETAILED DESCRIPTION

Figure 1A:
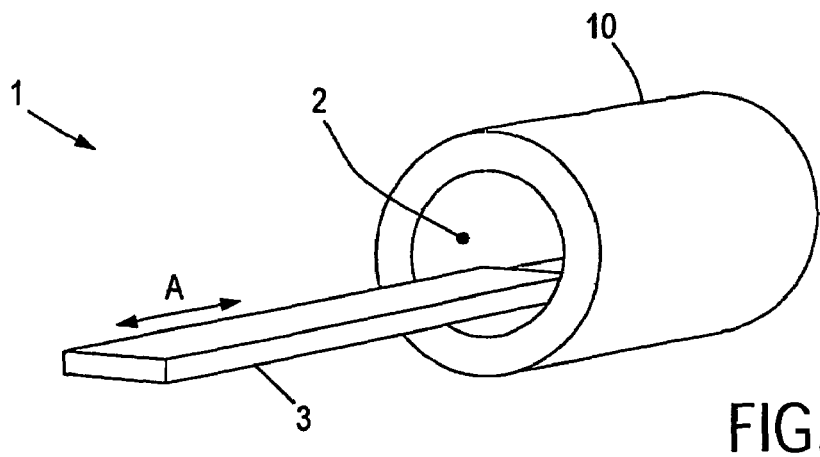
FIG. 1A schematically shows a perspective view of an MRI system according to the invention.
Figure 1B:
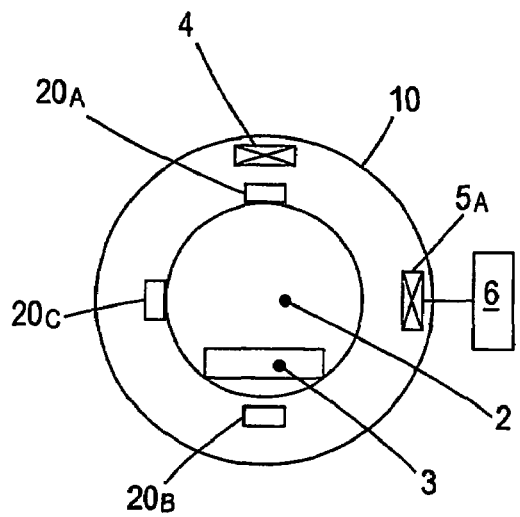
FIG. 1B schematically shows a cross section of the MRI system of FIG. 1A.

FIG. 1A schematically shows a perspective view of an MRI system 1, having an examination space 2 and a patient table or table top 3. FIG. 1B schematically shows a cross section of the MRI system 1, while FIG. 1C schematically shows a longitudinal section of the MRI system 1.

Figure 1C:
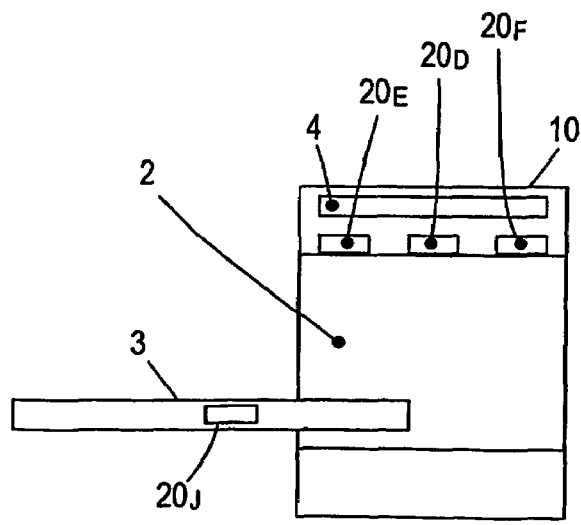
FIG. 1C schematically shows a longitudinal section of the MRI system of FIG. 1A.

For generating the required electromagnetic fields in the examination space 2, the MRI system 1 comprises a magnetic field generating system, comprising one or more suitably designed transmit coils, generally indicated at 4 in FIGS. 1B and 1C. Since such a transmit system is known per se, and since the present invention is not directed at improving the magnetic field generating system, and since the present invention can be implemented while using a known magnetic field generating system, it is not necessary here to discuss the design and operation of the magnetic field generating system 4 in more detail.

The magnetic field generating system 4 is mounted in a housing 10. In the embodiment illustrated, the MRI system 1 is of a cylindrical type, in which case the housing 10 has a generally cylindrical shape, extending around the examination space 2 which likewise has a generally cylindrical shape, the main axis of the cylindrical shape being directed substantially horizontally. In such a design, the static field or B0 field is directed substantially horizontally. It is noted that the housing usually has a circle-cylindrical shape, but an elliptical cylindrical shape is also possible.

The patient table 3 has a longitudinal direction aligned to the cylindrical examination space 2, and is arranged displaceably in a direction parallel to the said main axis of the cylindrical examination space 2, as indicated by arrow A in FIG. 1A. For example, the patient table 3 may be mounted slidable or rollable with respect to the housing 10, or may be arranged on a support with wheels to be rollable with respect to a floor. Thus, a patient, when lying on the patient table 3, can be positioned into the examination space 2. The longitudinal extent of the examination space 2 is relatively limited, in the order of about 50 cm or less, so the body part to be examined determines the required position of the table 3 with respect to the housing 10.

It is noted that other designs are possible, for instance a design where the static field or B0 field is directed substantially vertically, is which case the housing may comprise an upper housing and a lower housing each having a substantially disc-shaped contour, arranged above and below the examination space, respectively. Such a design is also known per se, indicated as "open system". Although the present invention is explained here specifically for the case of a cylindrical type of MRI system, it is noted that this is not intended to restrict the protective scope of the invention to such cylindrical type of MRI system, since the present invention is in fact applicable to any type of MRI system.

For sensing the electromagnetic resonance fields generated by the nuclear spins of the body under examination, and for generating electrical pickup signals which can be processed by an imaging computer 6, the MRI system 1 further comprises an electromagnetic resonance receive system, comprising one or more suitably designed receive antennas, generally indicated at 5 in FIGS. 1B and 1C. The resonance receive system 5 may include one or more of the transmit coils of the magnetic field generating system 4, mounted in the housing 10, as is known per se. Since the way in which receive antennas operate for generating electrical pickup signals is known per se, and since the signal processing by the imaging computer 6 is known per se, it is not necessary here to discuss this aspect in more detail.

The electromagnetic resonance receive system 5 comprises at least one dedicated receive coil 20. In a prior art system, the receive system also comprises a system of dedicated receive coils, which are implemented as separate elements, to be placed on a patients body, each being provided with a cable and a cable connector to be plugged into a socket of the housing 10 or the tabletop 3 or the computer 6. Dedicated receive coils of this type will be indicated as separate receive coils. In contrast, according to the present invention, said at least one dedicated receive coil 20 is fixedly attached to the housing 10.

There are several possibilities for the location of the fixed dedicated receive coil 20. FIGS. 1B and 1C illustrate six examples, being distinguished by addition of the letter A to F to the reference numeral 20.

With reference to FIG. 1B, the fixed dedicated receive coil 20 may be located above the examination space 2 (20A), or under the examination space 2 (20B), or horizontally adjacent the examination space 2 (20C). In fact, the fixed dedicated receive coil 20 may be located at any angular position. Further, the electromagnetic resonance receive system 5 may comprise multiple fixed dedicated receive coils located at different angular positions.

With reference to FIG. 1C, the fixed dedicated receive coil 20 may be located centrally with respect to the examination space 2 (20D), or at a table entrance side of the examination space 2 (20E), or opposite the table entrance side of the examination space 2 (20F). In fact, the fixed dedicated receive coil 20 may be located at any axial position.

Further, the electromagnetic resonance receive system 5 may comprise multiple fixed dedicated receive coils located at different axial positions.

Figure 2A:
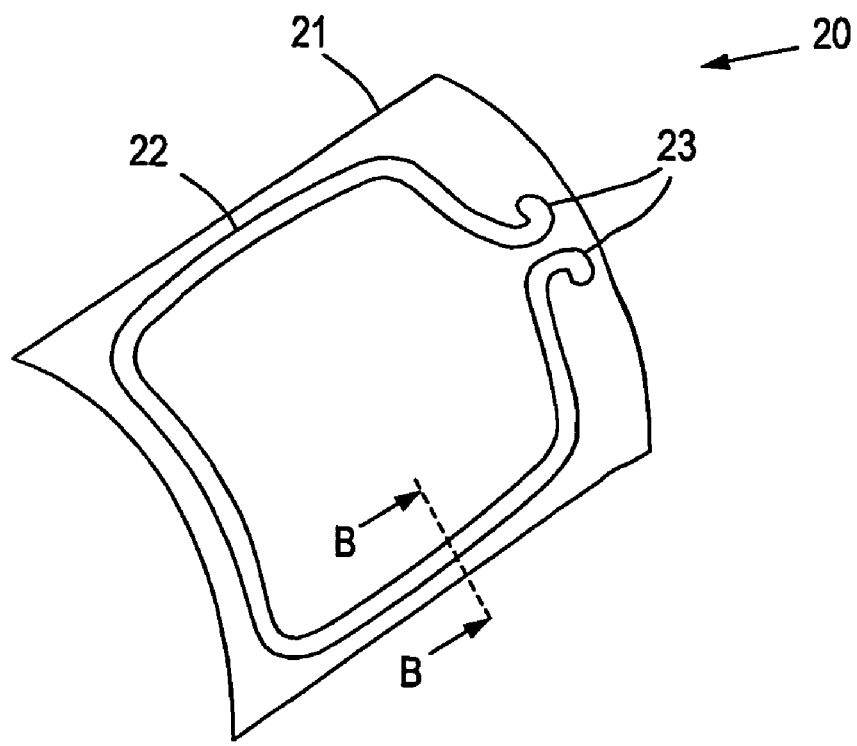
FIG. 2A schematically shows a perspective view of an embodiment of a fixed dedicated receive coil according to the present invention.
Figure 2B:
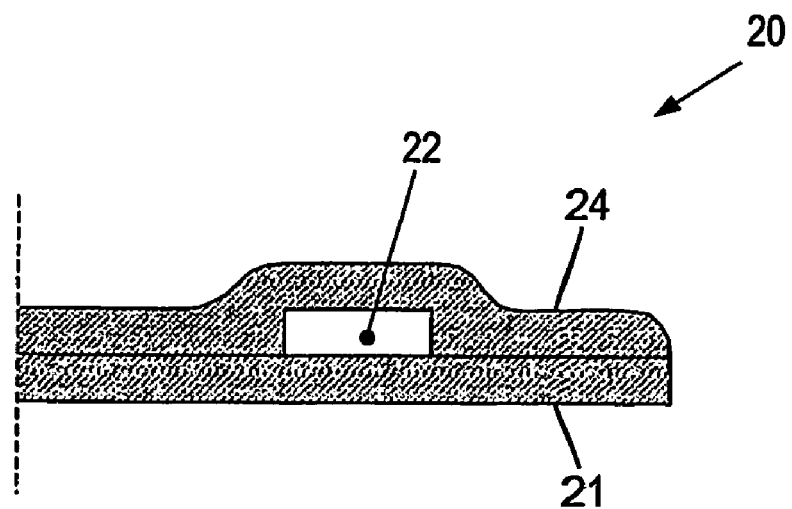
FIG. 2B schematically shows a partial cross section along the line B-B in FIG. 2A.

FIG. 2A is a perspective view of a suitable embodiment of a fixed dedicated receive coil 20 according to the present invention, and FIG. 2B is a partial cross section according to the line B-B in FIG. 2A. The coil 20 comprises a loop 22 of conductive material, preferably implemented as a thin strip of copper or the like, arranged on an insulating substrate 21, preferably a thin sheet of polycarbonate or the like. The loop 22 is not closed; end terminals are indicated at 23. The loop 22 effectively constitutes a coil having substantially one winding.

Preferably, as illustrated clearly in FIG. 2B, an insulating layer 24 is arranged on the substrate 21, extending over the loop 22, which insulating layer 24 may be made of the same type of material as the substrate 21.

In a preferred embodiment, the thickness of the substrate 21, the loop 22, and the insulating layer 24 is so small that the receive coil 20 is flexible, so that it can be bent, as illustrated in FIG. 2A. For instance, this thickness may be in the order of 1 mm or less. However, it is also possible that the substrate 21 is a stiff substrate, either by thickness or by choice of material, or both, so that the receive coil 20 has a constant shape. This shape may be flat, or curved.

In an advantageous embodiment, the receive coil 20 is made by etching all but the loop 22 away from a standard printed circuit board.

Figure 3:
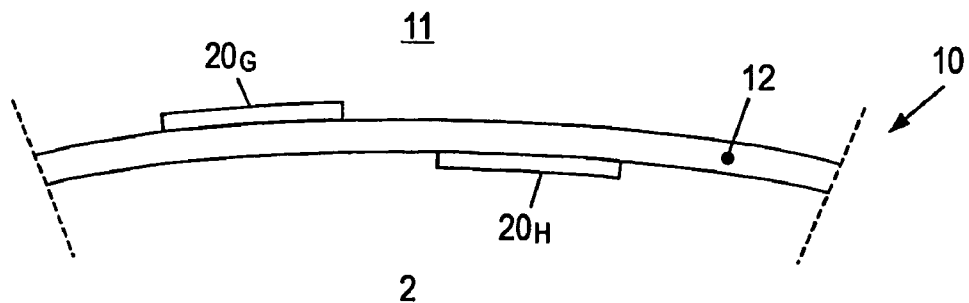
FIG. 3 schematically shows a partial cross section of a cover plate with coils attached to it.

On an enlarged scale, FIG. 3 schematically illustrates a cross section of a part of the upper wall of the examination space 2. This part of the wall comprises a cover plate 12 of the housing 10; the interior of the housing 10, containing the magnetic field generating system 4 (not shown in FIG. 3), is indicated at 11. Typically, the cover plate 12 is fixed to a frame (not shown) of the housing 10. The main function of the cover plate 12 is to prevent the patient from being able to touch any of the equipment inside the interior 11 of the housing 10, and more specifically to provide an electrical insulation with a view to the high voltages of this equipment.

It is noted that, in practice, the cover plate 12 is located very close to the elements of the magnetic field generating system 4 in order to let the size of the examination space 2 be as large as possible. Typically, in existing systems, the thickness of the cover plate 12 is in the order of 5 mm.

In the case of an existing MRI system, as well as in the case of a new design, the present invention can be implemented by fixing the dedicated receive coil 20 to the (existing) cover plate 12, as illustrated in FIG. 3. The dedicated receive coil 20 may be fixed to the interior of the cover plate 12 (20G) or to the exterior of the cover plate 12 (20H).

However, it is also possible for the MRI system 1 to comprise multiple dedicated receive coils 20, some being fixed to the interior of the cover plate 12 and others being fixed to the exterior of the cover plate 12. It is noted that, although the cover plate 12 is generally located very close to the elements of the magnetic field generating system 4, the distance between the cover plate 12 and said elements is not the same at all places. In some places, the radial distance between the cover plate 12 and said elements may be sufficiently large to accommodate a receive coil without any problems, in which case such relatively "large" locations are preferred for arranging one or more dedicated receive coils.

In the case of a dedicated receive coil 20G fixed to the interior of the cover plate 12, the cover plate 12 also functions as insulating protection between patient and receive coil. In the case of a dedicated receive coil 20H fixed to the exterior of the cover plate 12, it is advisable to apply a further cover plate (not shown) over the receive coil; especially if the receive coil 20 is mounted with the substrate 21 directed towards the examination space 2, this further cover plate may be a relatively thin plate, since the substrate 21 already provides insulation.

In any case, it should be clear that the addition of the thin, fixed, dedicated receive coil 20 in accordance with the present invention only marginally reduces the size of the examination space 2.

Figure 4:
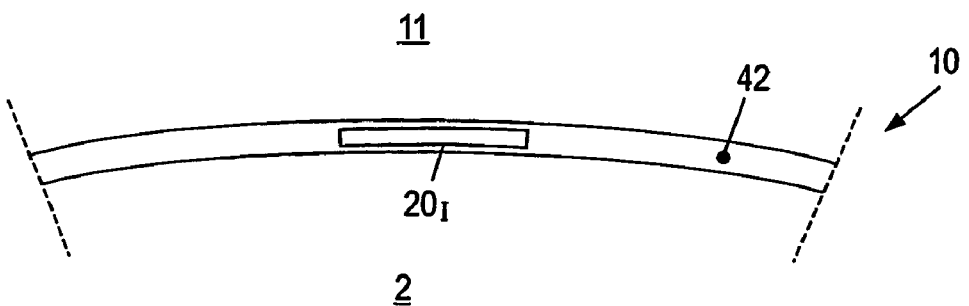
FIG. 4 schematically shows a partial cross section of a cover plate with an integrated coil.

It is also possible to design a new cover plate 42, to replace an existing cover plate 12, or as part of a newly manufactured MRI system, in which one or more dedicated receive coils (20I) are integrated, as illustrated in FIG. 4. In such a case, the receive coil 20I is embedded in the cover plate material, which automatically provides insulation.

Alternatively, in the case of a fixed dedicated receive coil 20 having sufficient stiffness and strength, for instance when made of PCB, it is possible to form the dedicated receive coil 20 itself in the form of a cover plate.

Figure 5:
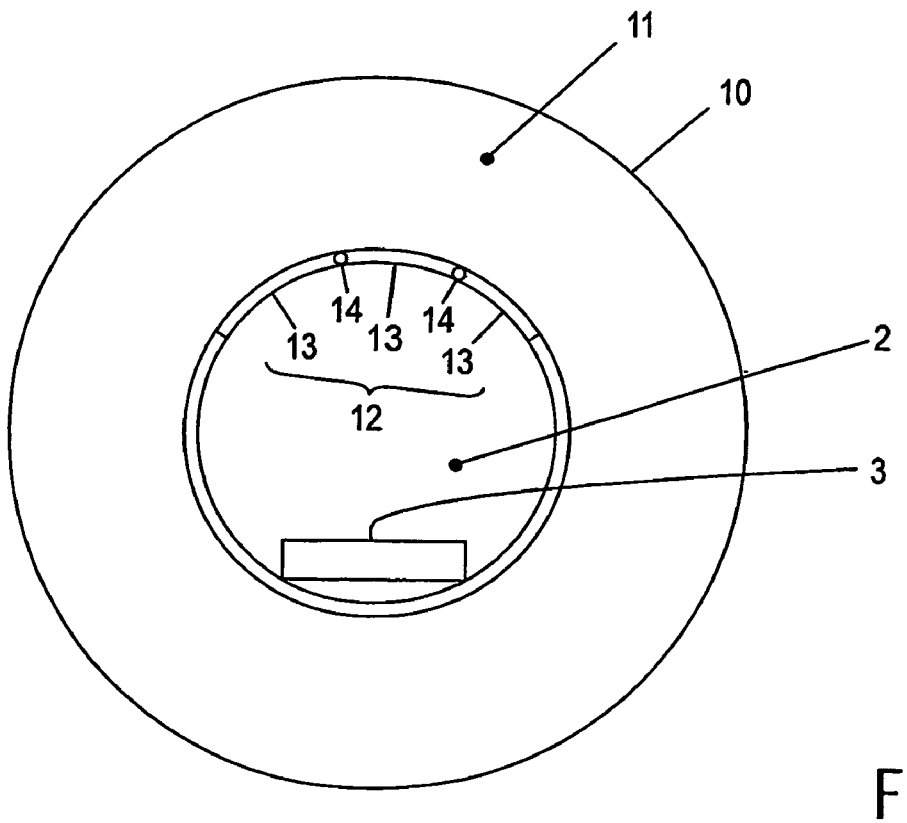
FIG. 5 schematically illustrates a cover plate comprising plate section hingedly coupled together.

In practice, it may be desirable to use one or more separate dedicated coils, for instance to obtain better image quality in cases where the relatively large distance between patient body and fixed dedicated receive coil 20 does not provide sufficient image quality. In such a case, it may be that the presence of the fixed dedicated receive coil 20 affects the operation of a separate dedicated coil. In order to be able to avoid this, it may be desirable to remove the fixed dedicated receive coil 20. To this end, in a preferred embodiment, a cover plate 12, 42 with at least one dedicated receive coil 20 affixed to it is implemented as a detachable part of the housing 10. In order to facilitate removal of such a cover plate 12, 42 and to facilitate replacement by a "blank" cover plate (i.e. without coils affixed to it), a cover plate 12, 42 in accordance with the present invention preferably comprises two or more plate segments 13, coupled to each other by hinges 14, as schematically illustrated in FIG. 5.

It should be clear to a person skilled in the art that the present invention is not limited to the exemplary embodiments discussed above, but that several variations and modifications are possible within the protective scope of the invention as defined in the appended claims.

For instance, apart from the at least one fixed dedicated receive coil 20, the MRI system 1 may comprise one or more separate antenna elements. For instance, especially for imaging a patient's head, a separate dedicated head coil is preferably used.

Further, the MRI system 1 may comprise one or more antenna elements mounted in or under the patient table, fixed to the patient table, as illustrated at 20J in FIG. 1C. Further, the MRI system 1 may comprise one or more antenna elements mounted under the patient table, fixed to the housing 10, located between rails which guide the table.

Further, it is possible that the housing and said rails are supported separately with respect to a floor. In such a case, the QBC (or other transmit coil) and the at least one fixed dedicated receive coil may both be fixed with respect to said rails. It is preferred that the at least one fixed dedicated receive coil is fixed with respect to at least one transmit coil of the magnetic field generating system, e.g. a QBC.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MRI system comprising:
   a housing defining an examination space for receiving a body for examination, the housing comprising at least one cover plate adjacent the examination space, the cover plate being used as a detachable part of the housing;
   a magnetic field generating system for generating a magnetic field in the examination space;
   a patient table displaceable into and out of the examination space;
   an electromagnetic resonance receive system which comprises at least one dedicated receive coil;
   wherein said at least one dedicated receive coil is fixedly attached to the cover plate of the housing.

2. The MRI system according to claim 1, wherein the electromagnetic resonance receive system further includes one or more additional receive coils mounted in or under the patient table and fixed to the patient table.

3. A magnetic resonance imaging system in which a generally cylindrical examination space is surrounded by a magnetic field generating system and an RF transmit system and further comprising:
   a housing which houses the magnetic field generating system and the RF transmit system, the housing including a cylindrical cover plate which surrounds the examination space and separates the examination space from the magnetic field generating system and the RF transmit coils;
   a patient table which selectively moves a patient into and out of the examination space; and,
   dedicated receive coils separate from the RE transmit system attached to the cylindrical cover plate, the dedicated receive coils being affixed to a surface of the cover plate which faces the RF transmit system.

4. The MRI system according to claim 3, comprising multiple fixed dedicated receive coils located at fixed positions relative to the examination space.

5. The MRI system according to claim 3, wherein the cover plate comprises two or more plate segments, coupled to each other by hinges.

6. The MRI system according to claim 3, wherein the dedicated receive coils are embedded in the cover plate, the cover plate being configured of an electrically insulating material.

7. The MRI system according to claim 3, further including:
   an additional dedicated receive coil mounted in the table to receive magnetic resonance signals from below the patient, the dedicated receive coils affixed to the cylindrical bore being disposed to the sides and above the patient to receive magnetic resonance signals from the sides and above the patient.

8. A magnetic resonance imaging (MRI) system having a magnetic field generating system and RF transmit coils, the MRI system further comprising:

a housin constructed of an electrically insulating material which surrounds the magnetic field generating system and the RF transmit coils and including at least one electrically insulating, detachably mounted cover plate which separates the magnetic field generating system and the RF transmit coils from an examination space, the at least one insulating cover plate including a plurality of interchangeable, detachable cover plates, one of the cover plates having the dedicated receive coils attached thereto and a second of the cover plates being a blank cover plate without coils affixed to it;

a table for movin a atient into and out of the examination space; and, a plurality of dedicated receive coils of a thickness of 1 mm or less affixed to the at least one insulatin cover late.

9. The MRI system according to claim 8, wherein the dedicated receive coil is fixed to the interior of the cover plate.

10. The MRI system according to claim 8, wherein the dedicated receive coil is integrated in the cover plate.

11. The MRI system according to claim 8, wherein the MRI system is configured to perform SENSE imaging and the dedicated receive coils of the electromagnetic resonance receive system further includes one or more separate antenna elements supported by the cover plate in fixed locations when the cover plate is attached to the housing.

12. The MRI system according to claim 8, wherein the dedicated receive coils are removably affixed to an examination space facing surface of the cylindrical cover plate.

13. The MRI system according to claim 8 wherein the dedicated receive coils are configured of thin copper strips.

14. The MRI system according to claim 8, wherein the dedicated receive coils include copper strips embedded in the at least one insulating cover plate.

15. The MRI system according to claim 8, wherein the dedicated receive coils are mounted on a substrate which is configured for detachable fixation to the cover plate.

16. The MRI system according to claim 8, wherein the insulating cover plate is cylindrical.

17. The MRI system according to claim 8, wherein the dedicated receive coils include a plurality of receive antenna elements and the MRI system includes a magnetic resonance imaging and reconstruction system that requires the position of the receive antenna elements to be accurately known and wherein the receive antenna elements of the dedicated receive coils are fixedly positioned to the at least one cover plate in accurately known positions.

* * * * *